United States Patent
Kurasawa et al.

(10) Patent No.: US 7,422,974 B2
(45) Date of Patent: Sep. 9, 2008

(54) METHOD OF MANUFACTURING ELECTRONIC COMPONENT MOUNTING BODY, ELECTRONIC COMPONENT MOUNTING BODY, AND ELECTRO-OPTICAL DEVICE

(75) Inventors: Munenori Kurasawa, Nagano (JP); Atsushi Saito, Nagano (JP)

(73) Assignee: Seiko Epson Corporation (JP)

( * ) Notice: Subject to any disclaimer, the term of this patent is extended or adjusted under 35 U.S.C. 154(b) by 484 days.

(21) Appl. No.: 11/098,120

(22) Filed: Apr. 4, 2005

(65) Prior Publication Data

US 2005/0224561 A1 Oct. 13, 2005

(30) Foreign Application Priority Data

Apr. 8, 2004 (JP) ............................. 2004-114117

(51) Int. Cl.
*H01L 21/44* (2006.01)
*H01L 23/48* (2006.01)
*H01L 23/52* (2006.01)
*H01L 29/40* (2006.01)

(52) U.S. Cl. ....................................... 438/613; 257/737

(58) Field of Classification Search ............ 228/180.22, 228/180.1, 215; 438/106, 108, 110, 612, 438/613–617, 669, 674
See application file for complete search history.

(56) References Cited

U.S. PATENT DOCUMENTS 6,236,112 B1   5/2001   Horiuchi et al.

2002/0063332 A1 *   5/2002   Yamaguchi et al. ......... 257/738
2005/0067635 A1     3/2005   Saito

FOREIGN PATENT DOCUMENTS

| JP | 08-111574 | 4/1996 |
|----|-----------|--------|
| JP | 2001-093934 | 4/2001 |
| JP | 2003-124259 | 4/2003 |
| JP | 2003-324126 | 11/2003 |

OTHER PUBLICATIONS

Communication from Japanese Patent Office regarding related application.

* cited by examiner

*Primary Examiner*—Jerry Lorengo
*Assistant Examiner*—Megha Mehta
(74) *Attorney, Agent, or Firm*—Harness, Dickey & Pierce, P.L.C.

(57) ABSTRACT

A method of manufacturing an electronic component mounting body is used for mounting an IC chip having a bumps as an external mounting terminal on a base material made of thermoplastic resin, comprising: a bump burying step of burying the bumps into the base material by heating and pressing the IC chip toward the base material to expose a portion of the bumps to a base material surface on the opposite side of the IC chip, and a step of forming a conductor conductively connected to the bump by arranging conductive material on the base material surface to which the portion of the bumps are exposed.

15 Claims, 9 Drawing Sheets

METHOD OF MANUFACTURING ELECTRONIC COMPONENT MOUNTING BODY, ELECTRONIC COMPONENT MOUNTING BODY, AND ELECTRO-OPTICAL DEVICE

RELATED APPLICATIONS

This application claims priority to Japanese Patent Application No. 2004-114117 filed Apr. 8, 2004 which is hereby expressly incorporated by reference herein in its entirety.

BACKGROUND

1. Technical Field

The present invention relates to a method of manufacturing an electronic component mounting body, an electronic component mounting body, and an electro-optical device.

2. Related Art

In general, for various electronic apparatuses, an electronic component such as a semiconductor IC is mounted on a circuit board to constitute a part of an electronic circuit. There are several methods in mounting the electronic component on the circuit board. For example, as a most typical one, a method is known in which a plurality of bumps of the electronic component are connected to a conductive pad on the circuit board, and under this state, under-fill resin is filled and encapsulated between the electronic component and the conductive pad.

In addition, as a mounting method widely used in a liquid crystal display device and the like, a method was provided in which an electronic component is mounted using an anisotropic conductive film (ACF) therebetween. In this method, by using the ACF in which minute conductive particles are dispersed into a thermosetting resin, the electronic component is heated with a heated and pressured head and intrusively pressed onto a glass substrate constituting a circuit board or a liquid crystal panel. The bumps of the electronic component and the terminal on the substrate are conductively connected through conductive particles, and the thermosetting resin is cured and the conductive connection is maintained under the above state.

In addition, a method of manufacturing an electronic component mounting body is known in which a circuit board with a conductive pad formed on one surface of the base material made of thermoplastic resin is prepared, and an IC chip with a plurality of bumps is heated and pressed onto a surface on the opposite side of the conductive pad forming surface of the circuit board so that the bumps are inserted into the thermoplastic resin of the circuit board and fixed with an end thereof conductively connected from inside of the circuit board to the conductive pad (for example, see Japanese Unexamined Patent Application Publication No. 2003-124259).

However, the above-described conventional mounting methods have the following problems. For example, for the method of filling the under-fill resin between the electronic component and the circuit board, injecting the under-fill resin takes a lot of trouble, and a void is easily generated in the under-fill resin around the bumps so that electrical reliability is reduced. In addition, for the mounting method using the ACF, as a pitch between the terminals is reduced, the conductive particles need to be small accordingly, leading to an expensive ACF itself and a short circuit between the terminals due to a bridge of the conductive particles.

For the method described in Japanese Unexamined Patent Application Publication No. 2003-124259, the afore-mentioned problems such as void of the resin and short circuit between the terminals do not occur, so that the terminal having a narrow pitch can be stably mounted on the substrate. However, the present inventors repeatedly conduct a study over the mounting method, which turns out the following facts to be improved.

In other words, the IC chip needs to be fixed on the substrate, as well as connected to the wiring formed on the related substrate, but when the IC chip is heated while pressed onto the substrate, position accuracy of the terminal is easily distorted due to a dimensional change of the thermoplastic resin having a high coefficient of thermal expansion. For this reason, the alignment between the bumps of the IC chip and the conductive pad (wiring) is hardly obtained. In addition, when resin residue is left between the end of the bump inserted into the substrate and the conductive pad, the bump and the conductive pad might not be perfectly connected. As such, in the conventional method of manufacturing the electronic component mounting body, new improvement is required in terms of production yield and mounting efficiency.

The present invention is contrived under these circumstances, and an object of the present invention is to provide a method of manufacturing an electronic component mounting body for mounting the electronic component on the circuit board easily and effectively with high electrical reliability at low costs.

SUMMARY

In order to achieve the afore-mentioned object, there is provided a method of manufacturing an electronic component mounting body for use in mounting an electronic component having a plurality of bumps as external mounting terminals on a base material made of thermoplastic resin, the method comprising: a bump burying step of burying the bumps into the base material by heating and pressing the electronic component toward the base material to expose a portion of the bumps to a surface of the base material on the opposite side of the electronic component; and a conductor forming step of forming a conductor conductively connected to the bumps by arranging conductive material on the surface of the base material on which the portion of the bumps are exposed.

With the manufacturing method described above, first, the bumps of the electronic component are penetrated into the base material and the ends of the bumps are exposed on the opposite side of the base material, and then, a conductor having a predetermined planar shape is formed on the exposed bump. Thus, the conductor accurately aligned to for the bumps formed in any size and pitch may be formed so that electrical reliability can be improved in a conductive connection structure between the bump and the conductor.

In addition, as described in Japanese Unexamined Patent Application Publication No. 2003-124259, in a case that the bump is buried while aligned to the conductor patterned in advance, when the conductor or the bump is formed with a narrow pitch, there occurs a problem in that the alignment thereof is not easily made. However, according to a manufacturing method according to the present invention, the alignment between the base material and the electronic component is not required so that a problem of the alignment like this does not occur.

In the manufacturing method of the present invention, the base material may be as thick as or 10 μm or less thick than a protrusion of the bumps of the electronic component from the surface of the electronic component. More preferably, in the method according to an aspect of the invention, the base material may be as thick as or 5 μm or less thick than a protrusion of the bumps of the electronic component from the surface of the electronic component. With the base material having a thickness within the afore-mentioned range, when the electronic component is heated and pressed to the base material, the base material is welded on an active surface of the electronic component on which the bumps are arranged, the packing between the base material and the electronic component is ensured.

According to a method of manufacturing an electronic component mounting body of the present invention, in the bump burying step, after the bumps are buried into the base material, the surface of the base material on the opposite side of the electronic component may be partially removed to expose the portion of the bumps at the surface of the base material on the opposite side of the electronic component.

With the manufacturing method described above, even when the protrusion height of the bumps differs from the base material thickness, it may be ensured that the bumps are exposed to the surface of the base material by removing the surface of the base material. In addition, when the bumps are pushed in a heated and pressured state, unevenness may occur on the surface of the base material on which the bump ends are arranged. However, by partially removing the surface of the base material, the unevenness is flattened so that reliability of the connection structure between the bump and the conductor is enhanced and the mounting of the related base material into the inserted other circuit board can be performed with high reliability.

According to a method of manufacturing an electronic component mounting body of the present invention, the surface of the base material may be partially removed through a chemical polishing process or a dry etching process. With the manufacturing method comprising this processing, an amount of the removed base materials surface can be controlled with high accuracy when the surface of the base material is removed. Therefore, the end of the bump can be favorably exposed to the surface of the base material while the exposed height can be easily controlled not to be excessive.

According to a method of manufacturing an electronic component mounting body of the present invention, in the conductor forming step, the conductor is formed through a metal plating method. Since the conductor is formed through the metal plating method, the conductor having a thick thickness as much as several μm can be easily formed, and thus, it is advantageous in terms of a processing speed and the manufacturing costs.

According to a method of manufacturing an electronic component mounting body of the present invention, the method may further comprise forming a metal base layer on a surface area of the base material including a portion of the bumps exposed through the base material, prior to the conductor forming step. With the manufacturing method described above, the metal base layer is interposed between the bump and the conductor, so that adhesiveness between the bump and the conductor can be improved and material with which these two portions are formed can be widely chosen. Thus, it is advantageous that a low resistance for the conductor and the bump can be obtained. In addition, when a plurality of bumps is arranged in the electronic component, the metal base layer is formed across them, which indicates a short circuit among the bumps. Thus, a breakdown of the circuit due to a static electricity in the process of the conductor formation can be effectively prevented.

According to a method of manufacturing an electronic component mounting body of the present invention, the conductor may be formed on the metal base layer either through an electrolytic plating method or an electroless plating method.

The conductor may be formed either through the electrolytic plating method or the electroless plating method, but in case that the metal base layer is arranged, when the related metal base layer is formed through the electrolytic plating method using an electrode, conductor forming efficiency can be improved.

According to a method of manufacturing an electronic component mounting body of the present invention, the conductor forming step may comprise: a step of forming a pattern of a mask material on the base material at which the portion of the bumps is exposed; and selectively arranging the conductor on the base material using the mask material as a mask.

With the manufacturing method described above, the conductor having a predetermined planar shape can be easily formed. In addition, when the related mask material is arranged on the metal base layer, a patterned conductor can be easily formed through an electrolytic plating method using the metal base layer as an electrode.

According to a method of manufacturing an electronic component mounting body of the present invention, the step of forming the pattern of the mask material may comprise a step of arranging photoresist on the base material and a step of exposing and developing the photoresist, wherein the step of exposing the photoresist may be performed using of a portion of the bumps exposed through the base material as a reference one. With the manufacturing method described above, alignment is made directly on the bumps of the electronic component to perform mask material formation. Thus, the mask material can be formed with high precision, and thus, the obtained positional accuracy of the conductor is favorable. With this, electrical reliability for the connection structure between the bump and the conductor can be improved. As the photoresist, both a liquid phase type deposited on the base material and a dry film type laminated on the base material can be applied.

According to a method of manufacturing an electronic component mounting body of the present invention, while performing the exposure of the photoresist, the bumps arranged on the electronic component may be used for alignment. In other words, by using a bump arranged as a reference one in advance among the bumps penetrating the base material, the alignment in the exposure process can be performed. When the reference bump is used, it is particularly effective to a case where the bump connected to the conductor is miniaturized and narrow pitched. That is, since a dimension or a pitch of the reference bump having different functions can be arbitrarily set, the appropriate reference bump can always be used as a reference of alignment. Thus, the alignment can be performed with high precision.

According to a method of manufacturing an electronic component mounting body of the present invention, the step of forming the pattern of the mask material may comprise a step of arranging photoresist on the base material and a step of exposing and developing the photoresist, and a reference mark for performing the exposure of the photoresist may be arranged using the bump exposed through the base material as a reference one. In other words, it is desirable that the reference of the alignment for the exposure process be the alignment relative to the bump. Thus, it is also possible that the alignment of the exposure is made using the positional mark arranged farther from the area where the bumps are formed.

According to a method of manufacturing an electronic component mounting body of the present invention, the method may comprise, prior to the step of arranging the photoresist, forming a protective member that covers the portion of the bumps exposed through the base material while forming the photoresist on the base material including the protective member, and then, removing the protective member, wherein the step of performing the exposure of the photoresist may be performed using the bump exposed by removing the protective member as a reference one.

With the manufacturing method described above, the bump considered as the alignment reference for the exposure process of the photoresist is masked with the protective member in advance, and the photoresist is deposited thereon, the protective member is lifted off to expose the bump. Thus, when the alignment is made for the bump on the lower layer of the photoresist, the task of alignment can be facilitated and performed with high precision. Therefore, according to the present manufacturing method, the mask material can be formed with high precision, and thus, the conductor with high precision can be formed.

According to a method of manufacturing an electronic component mounting body of the present invention, for the bump forming step, the height of the bump exposed through the base material may be determined to be 1 µm or more. Exposing the bump with the height of more than 1 µm or more is highly appropriate when used as a reference of the alignment for the previous exposure process.

Next, according to another aspect of the present invention, there is provided a method of manufacturing an electro-optical device having an electronic component, which can be obtained from the method of manufacturing the electronic component mounting body according to the present invention, mounted on the base material constituting an electro-optical panel either directly or through another circuit board.

With the manufacturing method, an electro-optical device having a drive circuit mounted with high reliability can be easily manufactured.

Next, according to the present invention, there is provided an electronic component mounting body for mounting an electronic component having a bump as an external mounting terminal on a base material with a conductor at one side, wherein the bumps of the electronic component may be exposed on the opposite side through the base material; and wherein the bump exposed at a surface of the base material and the conductor may be conductively connected through a metal base layer.

With the arrangement described above, an electronic component mounting body to which the bump and the conductor are conductively connected can be provided with high precision and reliability.

Next, according to the present invention, there is provided an electro-optical device having the electronic component mounting body mounted on the base material constituting an electro-optical panel either directly or through another circuit board. With the arrangement described above, an electro-optical device having the electronic component including the mounting structure with high reliability is provided.

Next, according to the present invention, there is provided an electronic apparatus having the electronic component mounting body of the present invention described above or the electro-optical device of the present invention is provided. The related electronic apparatus can have high reliability due to the electronic component mounting body in which the conductive connection structure with high precision is given to the bumps having narrow pitches. In addition, with the related electronic component mounting body, a display unit comprising the electro-optical device realized with high reliability is provided.

DETAILED DESCRIPTION

Exemplary embodiments of the present invention will now be described with reference to the accompanying drawings.

The accompanying drawings illustrated below schematically show the embodiments of the present invention, respectively, in which a shape and a dimensional ratio may be modified for convenience.

Method of manufacturing electronic component mounting body

A method of manufacturing an electronic component mounting body according to the present invention is a method in which the electronic component having bumps as external mounting terminals is mounted on the base material made of thermoplastic resin to connect the electronic component and the conductor on the base material surface to obtain the electronic component mounting body, which is characterized in that the method comprises a bump burying step of burying the bumps into the base material by heating and pressing the bumps of the electronic component toward the base material to expose a portion of the bumps onto another surface of to the base material and a conductor forming step of forming a conductor conductively connected to the bump by arranging a conductive material on the base material surface on which the portion of the bumps are exposed.

Hereinafter, while the method of manufacturing an electronic component mounting body according to the present invention will be described, the description herein involves a former part of the bump burying step and a latter part of the conductor forming step, in which the bump burying step is described in the first to third embodiments thereof while the conductor forming step is described in the first to third embodiments thereof.

Bump Burying Step;

First Embodiment

Figure 1:
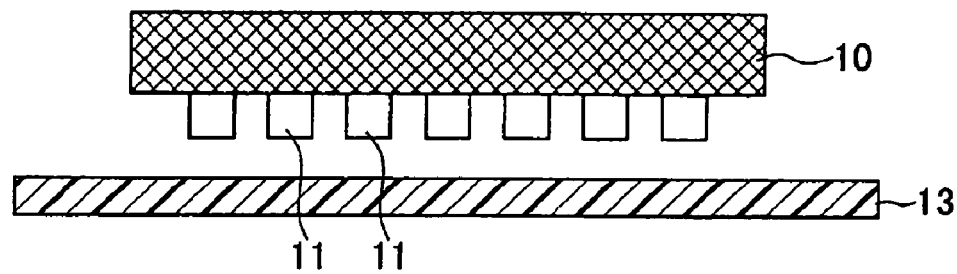
FIGS. 1(a)-(c) are cross sectional views for illustrating a bump burying step according to an embodiment of the present invention.
Figure 1:
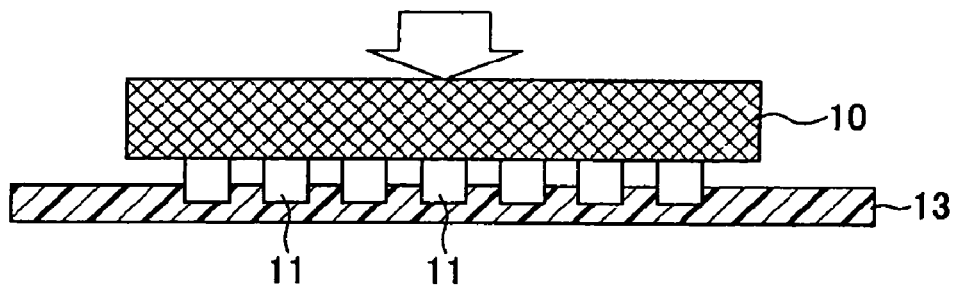
Figure 1:
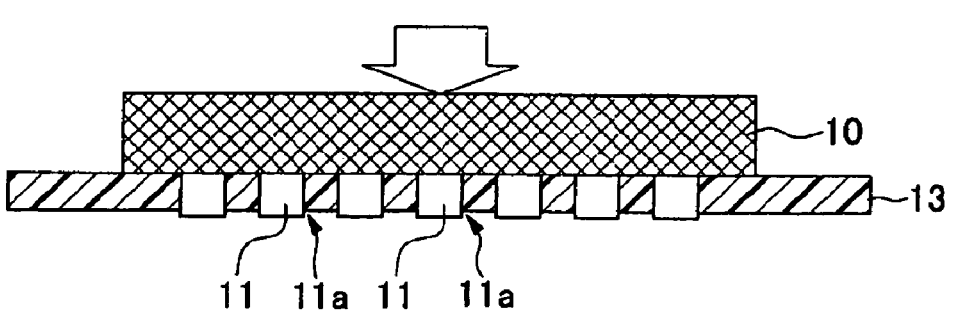

First, an embodiment of the present invention will be described with reference to the cross sectional view of FIG. 1. Hereinafter, among manufacturing methods of the electronic component mounting body according to the present invention, a first embodiment of the bump burying step will be described in detail.

According to the present embodiment, first, an IC chip (electronic component) 10 having a plurality of bumps 11 (herein, 7 bumps) that forms external connection terminals and a base material 13 made of thermoplastic resin are prepared, as shown in FIG. 1(a). The IC chip 10 constitutes a semiconductor substrate such as a silicon single crystal or a compound semiconductor single crystal, or a laminated ceramic substrate with a conductive layer interposed between a plurality of ceramic layers, and serves as an active surface that has a formation side of the bump 11 arranged in an electronic circuit structure. A thickness of the IC chip 10 is about 100 to 800 μm for the semiconductor substrate, and 1 to 5 mm for the ceramic substrate.

The bumps 11 may be made of a conductive material. However, since the bumps 11 are buried into the base material 13 described below, it may be made of metal material having a sufficient strength. More specifically, a metal material such as Cu, Ni, Au, Ag, and Al can be more preferably used. Alternatively, a central body made of Cu, Ni, and Al and the like is formed through a plating method, and the bumps 11 that cover a surface of the central body with a thin film such as Au, Ag, and Sn can be used. The bumps 11 are formed on the IC chip 10, for example, with a width of about 10 to 20 μm, a protrusion height of about 10 to 25 μm, and a pitch of about 15 to 30 μm. In addition, on the active surface of the IC chip 10 other than an area where the bumps 11 are arranged, a passivation layer made of silicon oxide or silicon nitride is formed in order to protect the circuit.

The base material 13 is made of a thermoplastic resin, such as polyester resin, a polyamide resin, an aromatic polyester resin, an aromatic polyamide resin, a tetrafluoroethylene resin, and a polyimide resin. According to the embodiment of the present invention, the base material 13 is deemed to be as thick as or a bit thicker than a protrusion of the bumps, in which, for example, when the protrusion height of the bumps 11 is 22 μm, the thickness of the base material 13 is preferably in a range of 22 to 32 μm, and more preferably, in a range of 22 to 27 μm. Like this, when the base material 13 is as thick as or a bit thicker than the protrusion of the bump 11, the bumps 11 can be easily penetrated into the base material 13 so that the latter part of the process can be efficiently performed. Moreover, when the base material 13 is deemed to be as thick as or 5 μm thicker than the protrusion of the bump 11, the base material 13 made of thermoplastic resin is welded into the active surface of the IC chip 10, so that packing between the base material 13 and the IC chip 10 can be ensured.

Next, as shown in FIG. 1(b), using a heating and pressing means (not shown), the IC chip 10 is heated and pressed onto one surface of the base material 13. Here, the IC chip 10 is heated and pressed up to more than softening temperature of the thermoplastic resin constituting the base material 13, the bumps 11 are injected into the softened and melted base material 13. The heating temperature at the time of burying the bumps is typically in a range of 120 to 450° C., which is equal to or lower than melt temperature of the bumps 11, caused even by the base material 13. In addition, in heating, the IC chip 10 may be heated from the opposite side of the active surface, or the base material 13 may be heated. Furthermore, with respect to the pressure, it is not limited to a case where the pressure is given from the side of the IC chip 10, the pressure may be given to the IC chip 10 fixedly supported by the base material 13, or both may be pressed with a roller and the like.

When the active surface of the IC chip 10 contacts with the base material 13 by keeping inserting it into the bump 11, the bumps 11 are penetrated through the base material 13 to be exposed on the opposite side thereof, as shown in FIG. 1(c). Thus, a step 11a is formed between the opposite side (bottom surface in Drawing) of the base material 13 and the exposed bump 11. Here, it is desirable the protrusion height of the bumps 11 and the thickness of the base material 13 are established such that the height of the bumps 11 exposed from the base material surface is 1 μm or more, in order to fully expose an end of the substrate 11 from the base material surface. The exposed portion is preferably 1 μm to 3 μm thick, and when exceeding 3 μm, a dielectric effect between the bumps 11 can be damaged due to thermoplastic resin left between the bumps 11. In addition, when the protrusion height of the bumps 11 is increased, unevenness on the surface of the base material 13 to which the end of the bumps 11 is exposed also increases. Thus, pattern formation accuracy may be easily troubled due to deposition speckle of photoresist or a focus difference at the time of exposure.

Bump Burying Step;

Second Embodiment

Figure 2:
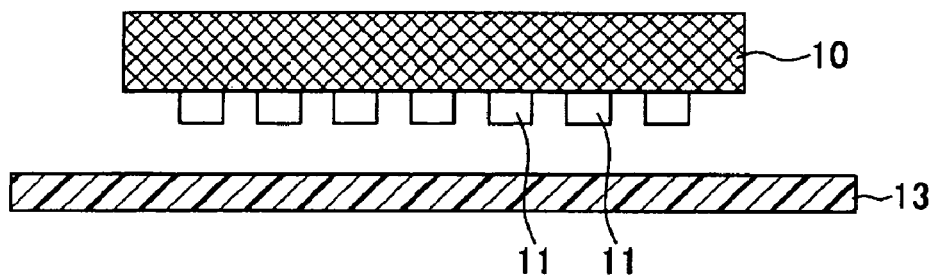
FIGS. 2(a)-(d) are cross sectional views for illustrating the bump burying step according to another embodiment of the present invention.
Figure 2:
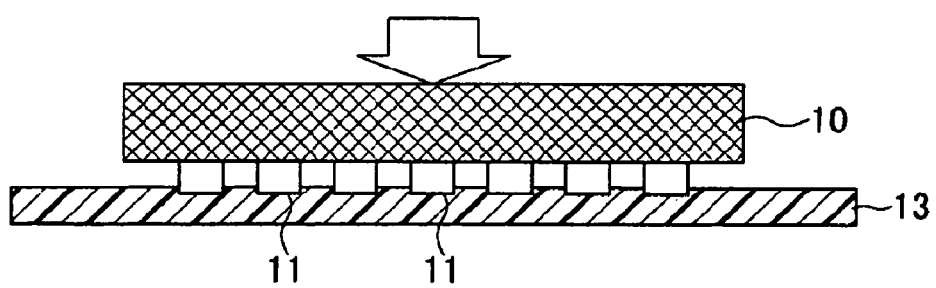
Figure 2:
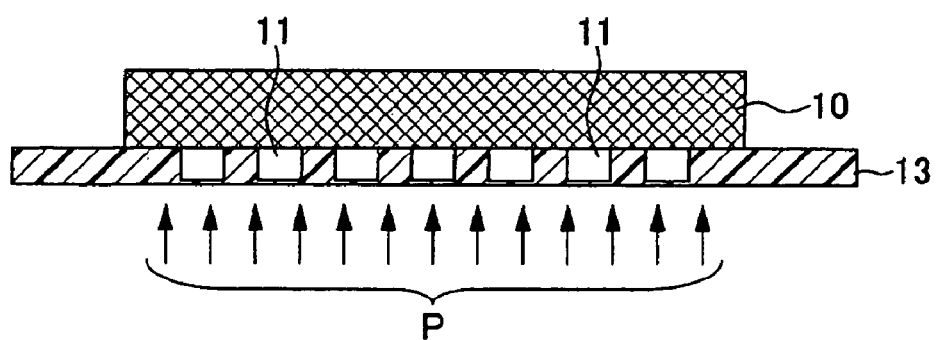
Figure 2:
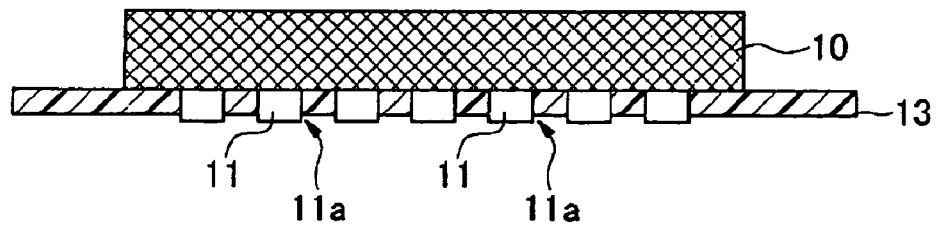

A second embodiment of the bump burying step will now be described with reference to FIG. 2. The IC chip (electronic component) 10 and the base material 13 used for the present embodiment is substantially the same as those shown in FIG. 1. In the present embodiment, conditions for heating and pressing and a method of exposing the bump from the base material surface are different from those of the first embodiment.

First, as shown in FIG. 2(a), when the IC chip 10 and the base material 13 are prepared, the IC chip 10 is pressed toward the base material 13 using the heating and pressing means (not shown) as shown in FIG. 2(b). In addition, the IC chip 10 and the base material 13 are heated up to more than a softening point of the thermoplastic resin constituting the base material 13, so that the bumps 11 are inserted into the base material 13.

According to the present embodiment, among the heating and pressing conditions for the afore-mentioned embodiment, the heating temperature is lowered by a predetermined amount, and a pressing time is reduced by a predetermined amount, under which the substrate is heated and pressed to cover the bump after heating and pressing.

Next, a processing of partially removing the opposite side (lower surface in Drawing) is performed with the IC chip 10 of the base material 13. This processing can be performed through a chemical polishing method using polishing solution or a dry etching method using plasma, in which only the desired amount of the surface of the base material 13 can be removed.

Through the above process, a portion of the bumps 11 is exposed to the surface of the base material 13 so that a step 11a controlled to be a predetermined height between the base material surface and the bumps 11 are formed as shown in FIG. 2(d). In the present embodiment, the bumps 11 are exposed such that the bumps 11 are inserted and then the surface of the base material 13 is partially removed. Thus, it is advantageous that the protrusion height of the bumps 11 from the base material surface can be controlled with high precision. In addition, according to the process of the present embodiment, an irregularity in the exposed state of the bumps 11 caused by the variation in the protrusion height of the bumps 11 and the variation in the thickness of the base material 13 can be effectively prevented. Furthermore, a high precision patterning can be realized.

In addition, the bumps 11 are inserted into the base material 13 by heating and pressing, so that the base material 13 around which the bumps 11 are inserted is modified a lot. The unevenness following the bumps 11 is generated on the lower surface of the base material 13 in the state shown in FIG. 2(c). However, when the surface of the base material 13 as described above is partially removed, the flattening of the base material surface can be obtained while exposing the bumps 11. Thus, in the subsequent process, the conductor can be easily and conductively connected to the bumps 11 with high reliability.

Bump Burying Step;

Third Embodiment

A third embodiment of the bump burying step will now be described with reference to FIG. 1. The IC chip (electronic component) 10 and the base material 13 used for the present embodiment is substantially the same as those shown in FIG. 1. The present embodiment is different from the first embodiment in that a step of partially removing the base material surface through chemical polishing and dry etching is further included.

In the present embodiment, the bumps 11 of the IC chip 10 are inserted into the base material 13 through processing shown in FIGS. 1(a) to 1(c), and the end of the bumps 11 is exposed to the opposite side (opposite side to the IC chip 10) of the base material 13. Subsequently, the process of partially removing the surface of the base material 13 to which the ends of the bumps 11 are exposed is performed. This process can be performed through a chemical polishing method using polishing solution or a dry etching method using plasma so that a desired amount of the surface of the base material 13 can be removed using this method.

The bumps 11 are inserted into the base material 13 by heating and pressing, so that the base material 13 around which the bumps 11 are inserted is modified a lot. Thus, unevenness around the bumps 11 are particularly generated as shown in FIG. 1(c), while when the surface of the base material 13 described above is partially removed, the control of the protrusion height of the bumps 11 as well as the flattening of the base material surface can be obtained. Thus, in the subsequent process, the conductor can be easily conductively connected to the bumps 11 with high reliability. In addition, while in the second embodiment the ends of the bumps 11 not exposed to the surface of the base material 13 are exposed through the chemical polishing method or the dry etching method, in the present embodiment, the surface of the base material 13 is partially removed with the end of the bumps 11 exposed in advance. Thus, compared with the second embodiment, a processing time taken for the chemical polishing process or the dry etching process can be reduced, resulting in improvement of the manufacturing efficiency.

In addition, according to the manufacturing method related to the present embodiment, the protrusion height of the bumps 11 from the base material surface can be controlled with high precision, an irregularity in the exposed state of the bumps 11 caused by the variation in the protrusion height of the bumps 11 and the variation in the thickness can be effectively prevented. Further, a high precision patterning can be realized.

Conductor Forming Process:

First Embodiment

Figure 3:
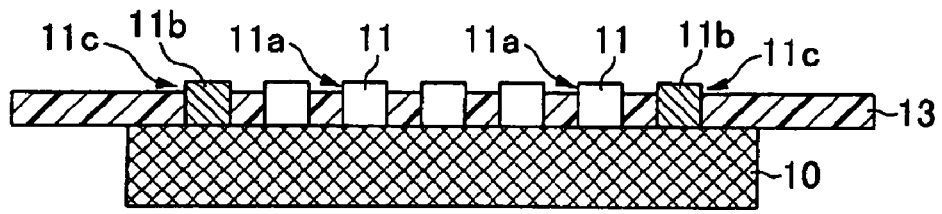
FIGS. 3(a)-(f) are cross sectional views for illustrating a conductor forming step according to an embodiment of the present invention.
Figure 3:
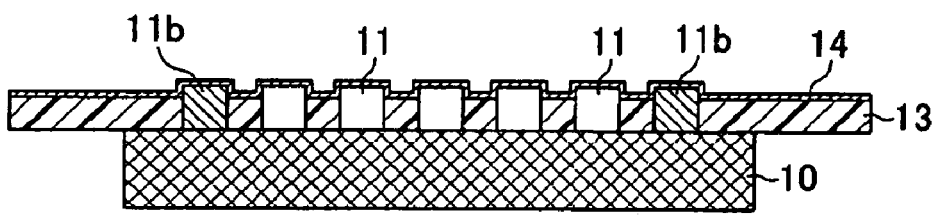
Figure 3:
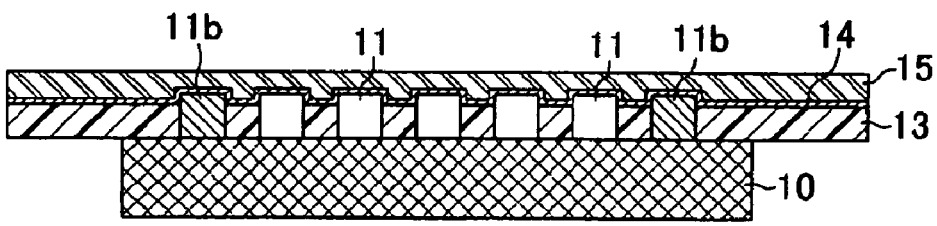
Figure 3:
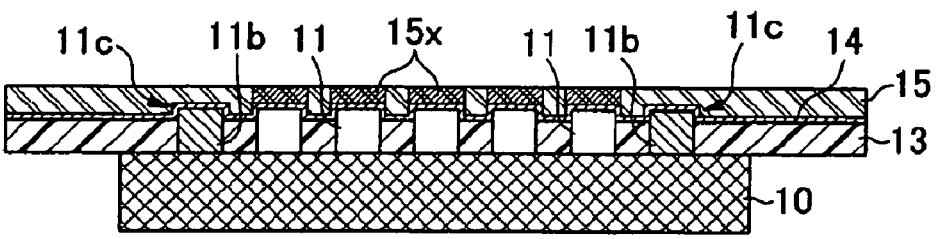
Figure 3:
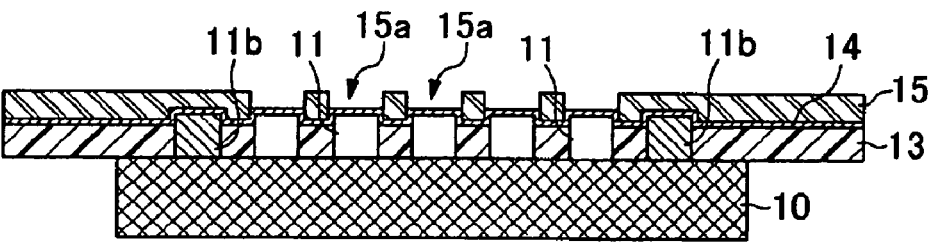
Figure 3:
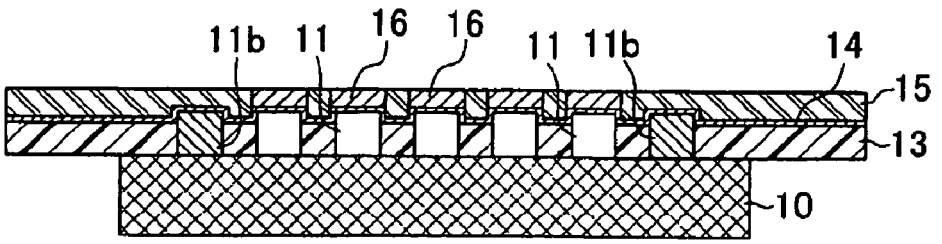
Figure 4:
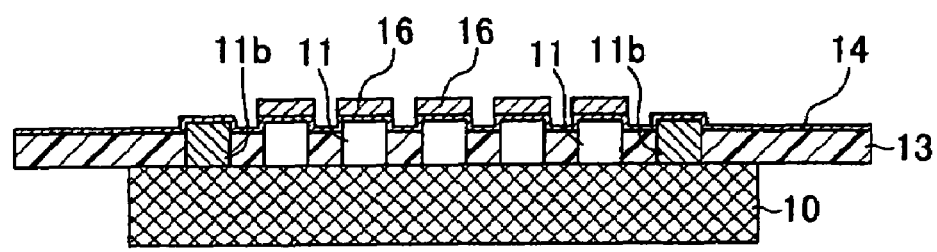
FIGS. 4(a)-(d) are cross sectional views for illustrating a conductor forming step according to an embodiment of the present invention.
Figure 4:
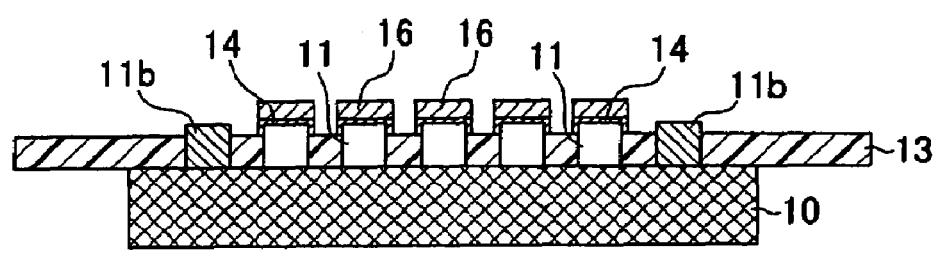
Figure 4:
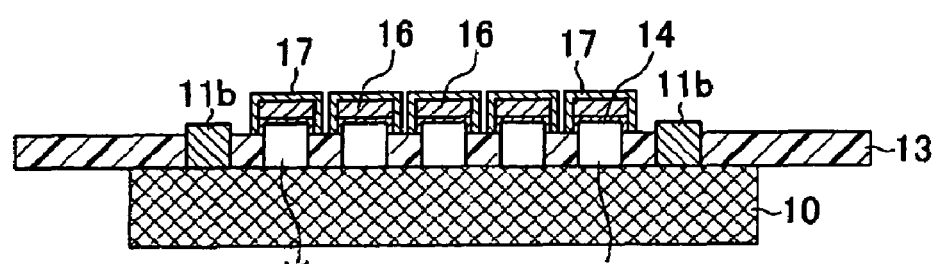
Figure 4:
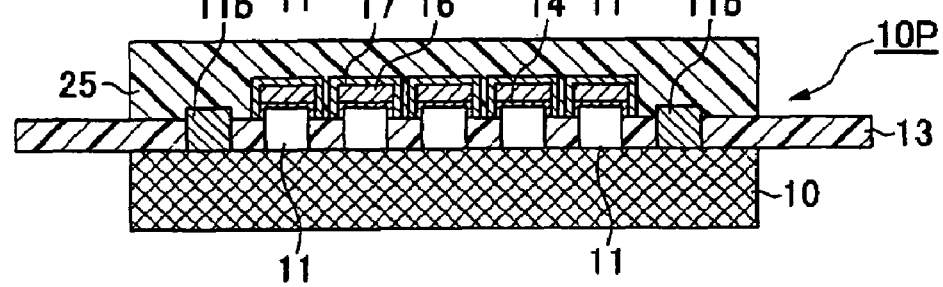

Among the method of the manufacturing the electronic component mounting body according to the present invention, a first embodiment of the conductor forming step will now be described with reference to FIGS. 3 and 4. Here, FIGS. 3(a) to 3(f) and FIGS. 4(a) to 4(c) are cross sectional views showing consecutive processing.

While, in the following the conductor forming step, a member connected to the base material 13 in a body is used as the IC chip 10 that can be obtained in the process shown in FIG. 2, in the present embodiment, bumps 11 and dummy bumps 11b located at both sides among the bumps 11 arrayed on one side of the IC chip 10 are described to be dummy bumps not connected to the conductors described below. In addition, for the dummy bumps 11b as well, the end thereof is exposed to the surface of the base material 13 so that there is a step 11c between the bumps 11b and the base material surface.

First, when a member in which the IC chip 10 is fixed to the base material 13 by the above bump burying step is obtained as shown in FIG. 3(a), a metal base layer 14 is formed on the surface (shown surface) of the base material 13 to which the bumps 11 and the dummy bumps 11b are exposed, through a sputtering method or a deposition method, as shown in FIG. 3(b). The metal base layer may be made of metal material such as Cu or TiW, or Cr, Mo, MoW, Au, and Ag. In addition, when the conductor is formed through the electrolytic plating method in order to increase adhesiveness between the bumps 11 and the conductor conductively connected to the bumps 11 in the subsequent process, the electrode formed herein may also be used. Furthermore, a short circuit is made between the related metal base layer 14 and the bumps 11, so that even when a static electricity is generated during the process, the circuit arrangement of the IC chip 10 can be effectively protected.

Next, as shown in FIG. 3(c), a photoresist 15 is deposited so as to cover the metal base layer 14. The photoresist acts as a mask material for forming a pattern of the conductor in the subsequent process. In addition, while the present embodiment is described in the context that a positive type resist is used, but a negative type photoresist may be used.

Next, as shown in FIG. 3(d), the photoresist 15 is a mask exposed to form an exposed portion 15x in the photoresist 15. The exposed portion 15x is formed in an area containing an area on the bumps 11.

In the manufacturing method according to the present embodiment, when the photoresist is exposed for use in the mask material, the dummy bump 11b protruded out of the base material 13 is used as a reference bump, or a reference of the alignment at the time of exposure. For example, when a reference point is set to the step 11c between the dummy bumps 11b and the surface of the base material 13 to perform the mask exposure of the photoresist 15, the exposed portion 15x can be formed with significantly high precision. By using the photoresist 15 patterned with this as mask material, the conductor formed herein can improve electrical reliability.

Next, as shown in FIG. 3(e), the photoresist 15 is developed to remove the exposed portion 15x, so that an opening 15a is formed at an area on the bumps 11. Here, the metal base layer 14 formed on the bumps 11 is exposed at the bumps 11. Subsequently, as shown in FIG. 3(f), metal material such as Cu or Au, and Sn is selectively arranged on the opening 15a, so that a conductor 16 having a predetermined planar shape is obtained. When the metal base layer 14 is not formed on the bumps 11, a choice of material for forming the conductor 16 may be limited due to the relation with the material of the bumps 11. However, in the present embodiment, the metal base layer 14 is arranged so that various types of material can be used as material for forming the conductor 16, and at the same time, the electrical reliability for the connection structure between the bumps 11 and the conductor 16 can be enhanced regardless of the composition material thereof.

Next, the photoresist 15 is lifted off as shown in FIG. 4(a), and then, etched to remove the surface of the base material 13 and the metal base layer 14 of the surface of the dummy bumps 11b from the conductor 16.

Next, as shown in FIG. 4(c), a surface protective layer 17 is formed on the surface of the conductor 16 at an area other than a protective dielectric layer through an electrolytic plating method. When the electrolytic plating is performed using the metal base layer 14 and the conductor 16 formed on the base material 13 as electrodes, the surface protective layer 17 can be selectively formed on the surface of the conductor 16 in a desired height. The surface protective layer 17 is formed of a stable metal material such as Au in 0.01 μm to 0.5 μm thick. In addition, when the surface protective layer 17 is made of material having favorable conductivity, a resistance of wiring arranged along with the conductor 16 can be reduced.

Next, a protective dielectric layer 25 is deposited at an area including the conductor 16 and the dummy bumps 11b covered with the surface protective layer 17, so that the electronic component mounting body 10P according to the present invention is obtained.

In addition, the protective dielectric layer 25 is arranged, if necessary. For example, when the protective dielectric layer 25 is not arranged, there may be a case where the electronic component mounting body 10P contacts with another circuit board using the base material 13. In this case, the portion of the surface of the base material 13 adjacent to the conductor 16 is softened and melted, and fixed to another circuit board. Thus, the electronic component mounting body 10P can easily contact with another circuit board so that the electronic components can be mounted highly effectively.

Conductor Forming Step:

Second Embodiment

Figure 5:
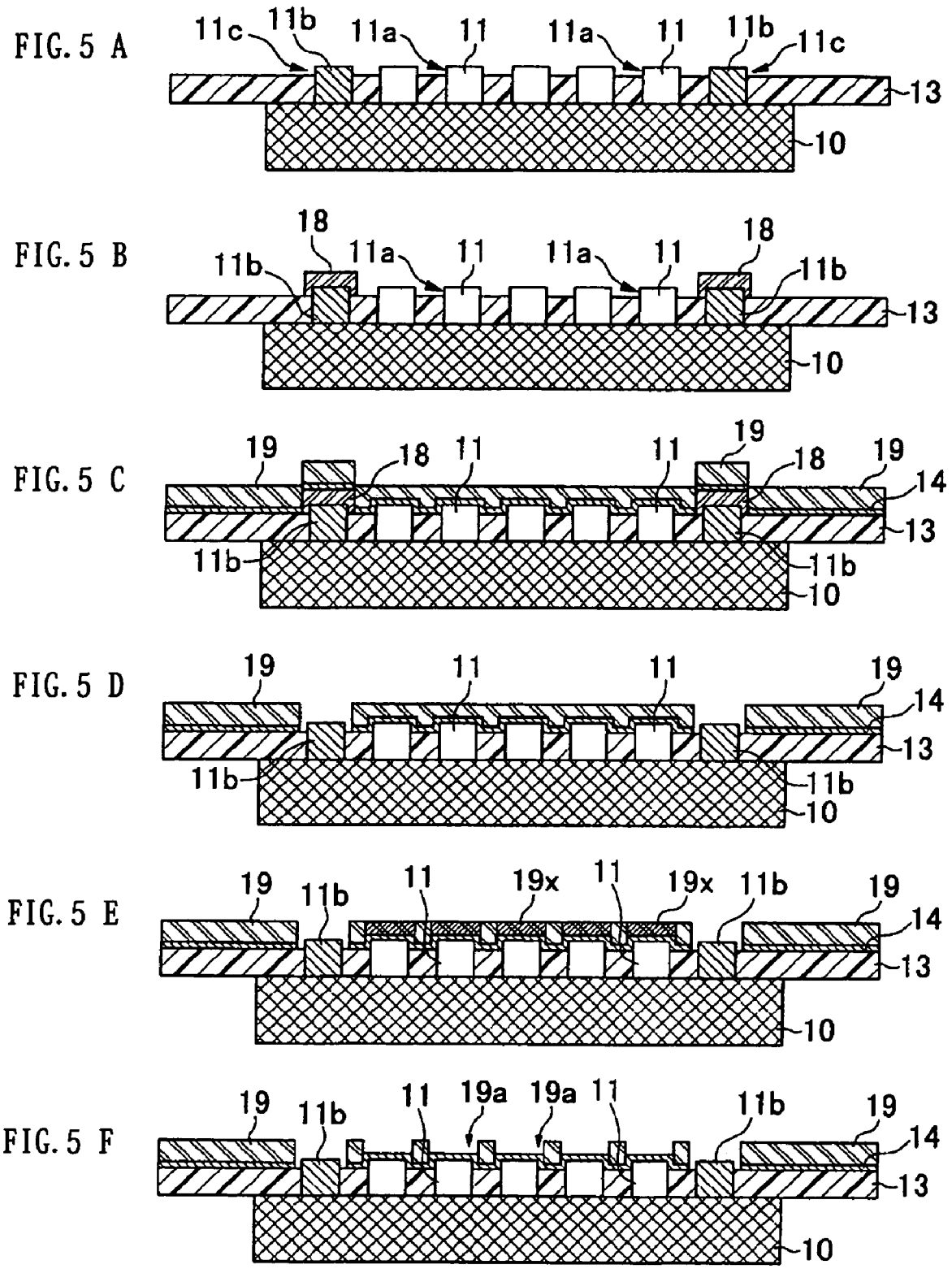
FIGS. 5(a)-(f) are cross sectional views for illustrating the conductor forming step according to another embodiment of the present invention.
Figure 6:
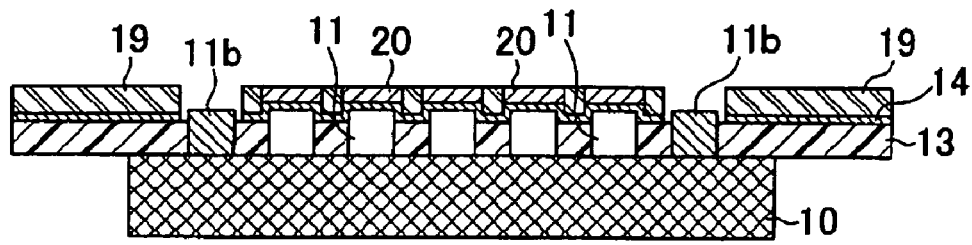
FIGS. 6(a)-(e) are cross sectional views for illustrating the conductor forming step according to another embodiment of the present invention.
Figure 6:
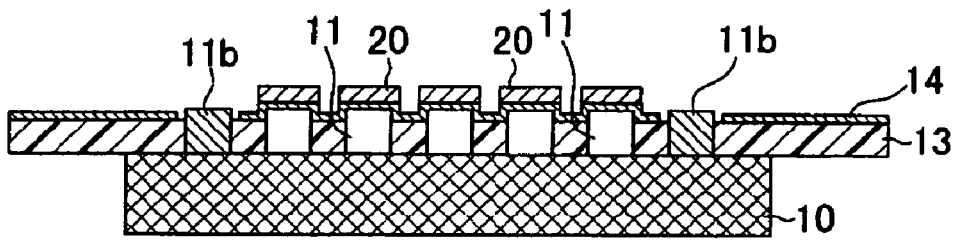
Figure 6:
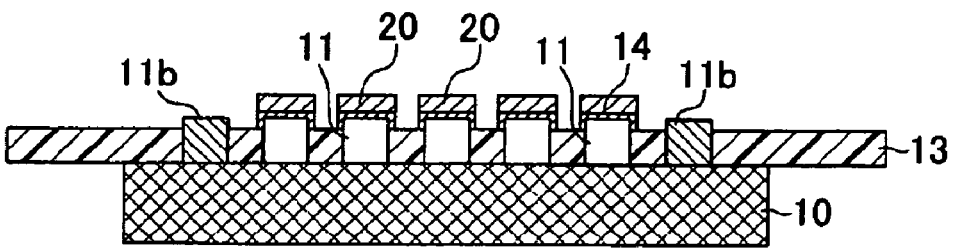
Figure 6:
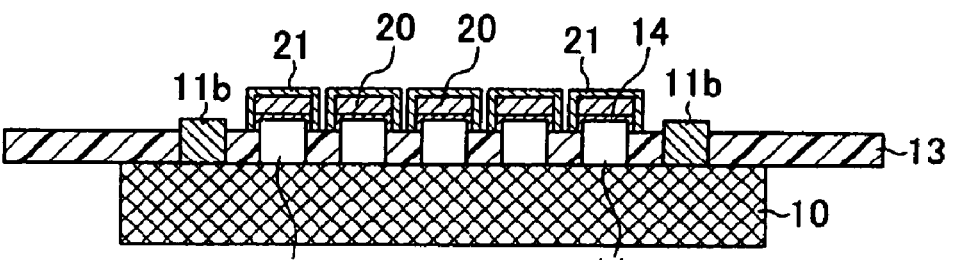
Figure 6:
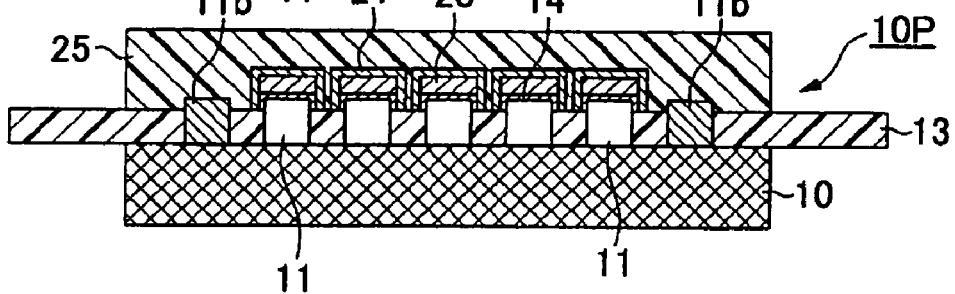

Next, a second embodiment of the conductor step will be described with reference to FIGS. 5 and 6. Here, FIGS. 5(a) to 5(f) and FIGS. 6(a) to 6(e) are cross section views in the successive processing.

In the conductor forming step of the present embodiment as well, a member in which the base material 13 contacts with the IC chip 10 in a body is used, as in the afore-mentioned embodiment. Therefore, the bumps 11b and 11b arranged at both sides of the IC chip 10 are dummy bumps used for a reference bump at the time of exposure.

In the conductor forming step according to the present embodiment, first, a member in which the base material 13 contacts with the IC chip 10 in a body through the bumps 11 is prepared as shown in FIG. 5(a), and then, protective members 18, 18 covering the dummy bumps 11b, 11b, respectively, are formed as shown in FIG. 5(b). The protective member 18 is made of, for example, material that is easily lifted off such as a masking tape. In addition, when the dummy bumps 11b is excessively small, it is difficult to attach the masking tape. However, the dummy bumps 11b acts differently from the bumps 11, so that even when the bumps 11 are formed in a narrow pitch, it is not necessary to have a miniaturized the dummy bumps 11b and it will be enough that the dummy bumps 11b is formed with a sufficient dimension located somehow far from the bumps 11.

Next, as shown in FIG. 5(c), the metal base layer 14 is formed to cover the base material 13 including the protective member 18 and the bumps 11, and subsequently, the photoresist 19 is deposited to cover the metal base layer 14.

Next, as shown in FIG. 5(d), the protective member 18 on the dummy bumps 11b is lifted off. Then, a portion of the photoresist 19 and the metal base layer 14 laminated on the protective member 18 are removed along with the protective member 18 so that the dummy bumps 11b, 11b are exposed.

Next, as shown in FIG. 5(e), the photoresist 19 is mask exposed using the dummy bumps 11b exposed in the above process as a reference dump to form the exposed portion 19x at a predetermined area including the bumps 11. In the present embodiment, alignment is performed with the dummy bumps 11b exposed and using the step 11c thereof. Therefore, compared with the exposed process for the afore-mentioned embodiment shown in FIG. 3, a location of the exposure mask can be determined with high precision. Thus, even when the bumps 11 are arranged in a narrow pitch, the exposed portion 19x can be formed at the exact place.

Next, as shown in FIG. 5(f), the photoresist 19 is developed and the exposed portion 19x is removed to form the opening 19a at an area including the bumps 11. With the removal of the exposed portion 19x, the metal base layer 14 under the opening 19a is exposed.

Subsequently, as shown in FIG. 6(a), a conductor 20 made of metal material such as Cu is formed through the electrolytic plating method. The reason that the electrolytic plating method is used is that the conductor 20 having a shape corresponding to the opening 19a can be easily formed by depositing the metal base layer 14 as an electrode.

Next, as shown in FIG. 6(b), the photoresist 19 is removed, and then, as shown in FIG. 6(c), the metal base layer 14 on the base material 13 is removed. A portion of the metal base layer 14 is left under the conductor 20, thereby acting as an adhesive layer with the bumps 11.

Next, as shown in FIG. 6(d), a surface protective layer 21 is formed on the surface of the conductor 20 through the electrolytic plating method. The surface protective layer 21 herein has the same arrangement as the surface protective layer 17 of the afore-mentioned embodiment. Further, as shown in FIG. 6(e), a protective dielectric layer 25 is formed at an area on the base material 13 including the conductor 16 and the bumps 11, so that the electronic component mounting body 10P according to the present invention is obtained.

As described above, in the manufacturing method according to the present invention, first, for the bump burying step, the bumps 11 of the IC chip 10 are penetrated through the base material 13, and the end thereof is protruded out of surface of the base material 13. Thus, at the time of the exposure processing in the latter part of the conductor forming step, alignment can be performed using the bumps 11 protruded out of the base material as a reference, which facilitates selective formation of the conductor with high precision. Accordingly, the electronic component mounting body 10P in which the conductor 16 is conductively connected to the bumps 11 with electrical reliability can be obtained.

In the description of the afore-mentioned Patent Document 1, the bump is aligned to the conductive pattern already arranged on the base material to perform mounting of the IC chip. Thus, when the bumps and the conductive patterns are arranged in a narrow pitch, it is highly difficult to make alignment. However, according to the manufacturing method of the present invention, the conductor 16 can be arranged to the bumps 11 exposed to the surface of the base material 13 with high precision. Thus, even when the arrangement gap of the bumps 11 is small, the conductor 16 can be arranged with sufficient accuracy.

In addition, while the first embodiment has been described in the context that the photoresist is exposed using the dummy bumps 11*b* arranged on the IC chip 10 as a reference bump, it is also possible that one or a plurality of bumps 11 conductively connected to the conductor 16 can be used as a reference bump. In addition, it is also possible that the reference mark aligned to the dump 11 protruded out of the base material 13 is formed on the photoresist 15 through a laser manufacturing to perform alignment of the exposure mask to the related reference mark.

Electro-Optical Device

Exemplary embodiment of an electro-optical device according to the present invention will now described with reference to FIGS. 7 to 11.

First Embodiment

Figure 7:
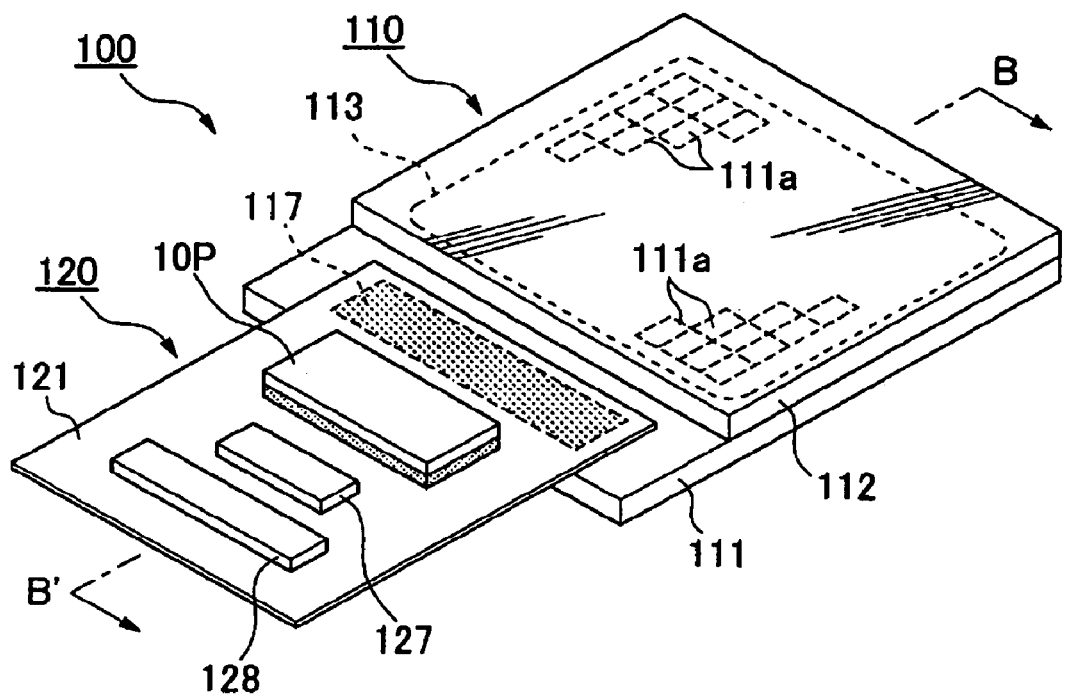
FIG. 7 is a perspective view showing a first embodiment of an electro-optical device.
Figure 8:
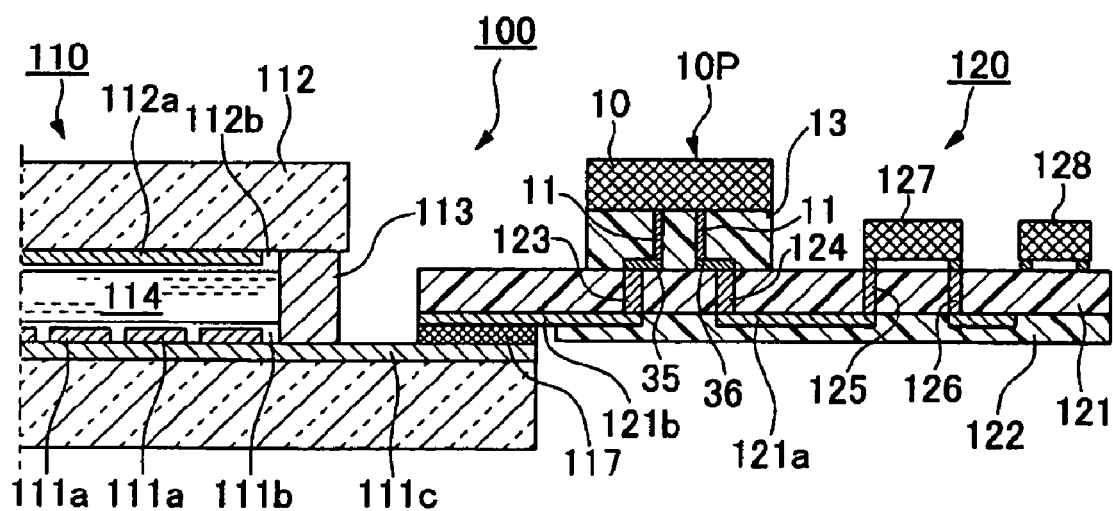
FIG. 8 is a cross sectional view taken along a line B-B' of FIG. 7.

FIG. 7 is a perspective view showing a first embodiment of the electro-optical device according to the present invention, and FIG. 8 is a partial cross sectional view taken along a line B-B' of FIG. 7.

An electro-optical device 100 shown in FIG. 7 comprises the electronic component mounting body 10P that can be obtained from the manufacturing method of the previous embodiment. Here, the electronic component mounting body 10P preferably includes a circuit (i.e., a mounting body of the IC chip for driving liquid crystal) for generating a driving signal that drives the electro-optical device into an electronic structure area.

The electro-optical device 100 of the present embodiment is a liquid crystal display device, and includes an electro-optical panel (liquid crystal panel) 110 and a circuit board mounted thereon (a flexible wiring substrate) 120, as shown in FIGS. 7 and 8. The electro-optical panel 110 is a pair of substrate 111 and 112 made of glass or plastic attached by a sealant 113. Liquid crystal (electro-optical material) 114 is encapsulated between two substrates 111 and 112. On the inner surface of the base material 111, a plurality of pixel electrodes 111*a* made of a translucent conductive material such as indium tin oxide (ITO) are arranged, and an alignment layer 111*b* is deposited thereon. In addition, on the inner surface of the substrate 112, a transparent electrode 112*a* made of the same material described above is formed, and an alignment layer 112*b* is covered thereon. In addition, though not shown, on the outer surface of the substrates 111 and 112, a polarization plate or a retardation film may be arranged.

Further, the circuit board 120 has a wiring pattern 121*a* made of Cu and the like on a surface (lower plane) of a dielectric substrate 121. The dielectric substrate 121 is made of thermosetting resin such as epoxy and polyimide, or thermoplastic resin such as polyester, polyamide, aromatic polyester, aromatic polyamide, tetrafluoroethylene, and polyimide. The wiring pattern 121*a* is covered with a protective layer 122 except for a terminal portion such as a connection terminal unit 121*b* to the electro-optical panel 110. The connection terminal unit 121*b* conductively connects with the wiring 111*c* on the surface of the base material 111 through an anisotropic conductive layer 117.

In addition, the wirings 111*c* are conductively connected to the pixel electrodes 111*a* and the transparent electrodes 112*a* and drawn out of a substrate pendent unit (unit attached to the peripheral rather than a contour of the substrate 112) of the substrate 111, respectively.

On a surface (shown surface) on the opposite side of the surface where the wiring pattern 121*a* of the dielectric substrate 121 is formed, connection pads: 123, 124, 125, and 126 conductively connected to the wiring pattern 121*a* are exposed. Further, various electronic components 127 and 128 are mounted on these connection pads. On the connection pads 123 and 124, the electronic component mounting body 10P described above is mounted. The electronic component mounting body 10P is tightly pressed down to the circuit board 120 under a heated state by a heating and pressing head. With this, a portion of the surface of the base material 13 made of thermoplastic resin is softened and melted, and the base material 13 made of thermoplastic resin covers around the conductive connection portion between the conductors 35 and 36 and the connection pads 123 and 124 to perfectly seals a gap between the electronic component mounting body 10P and the dielectric substrate 121. With this, a task of injecting under-fill resin is not required, so that a mounting task is facilitated and a void generation can be suppressed, leading to improvement of electrical reliability of the mounting structure. In addition, the conductors 35 and 36 of the electronic component mounting body 10P correspond to a structure stacked with the conductor 16 and the surface protective layer 17, shown in FIG. 4.

In particular, when the dielectric substrate 121 of the circuit board of the present embodiment is made of thermoplastic resin, melting adhesiveness between the electronic component mounting body 10P and the thermoplastic resin base material 13 is favorable so that a mounting structure having a sufficient retention and encapsulation can be obtained.

Second Embodiment

Figure 9:
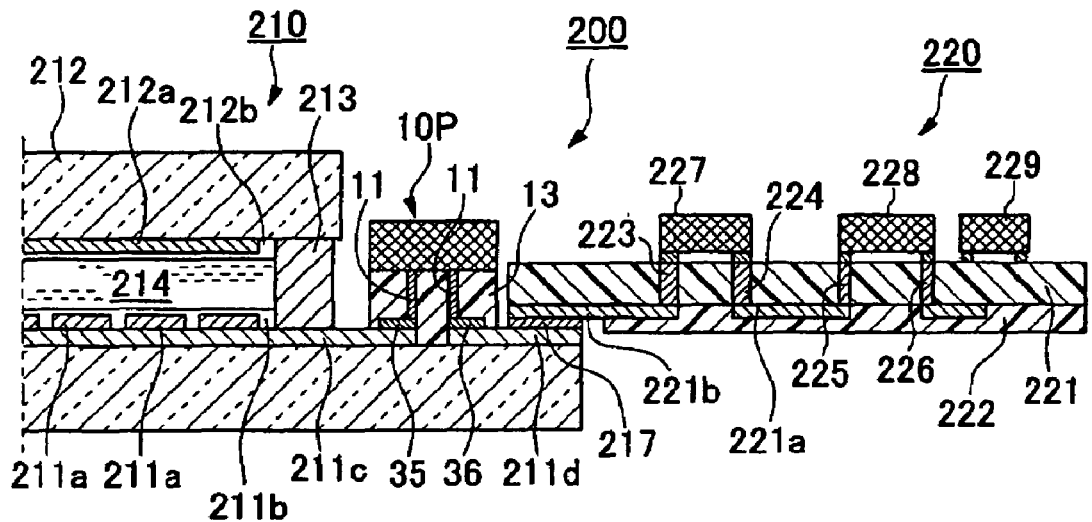
FIG. 9 is a cross sectional view showing a second embodiment of an electro-optical device.

A second embodiment of the electro-optical device according to the present invention will now be described with reference to FIG. 9. FIG. 9 is a partial cross sectional view of the electro-optical device according to the present embodiment, and corresponds to a cross sectional view taken along a line B-B' of FIG. 7, with respect to the overall configuration of the electro-optical device.

The electro-optical device (liquid crystal display device) 200 has an electro-optical panel 210 and a circuit board 220 mounted thereon. The electro-optical panel 210 has substantially the same arrangement as that electro-optical panel 110 of the first embodiment, in which substrates 211 and 212, a pixel electrode 211*a*, a transparent electrode 212*a*, alignment layers 211*b* and 212*b*, a wiring 211*c*, sealant 213, liquid crystal (electro-optical material) 214 and an anisotropic conductive layer 217 are the same members as those described in the first embodiment, so description thereof will be omitted. However, in the present embodiment, an input wiring 211*d* conductively connected to the circuit board 220 is formed separately from the wiring 211*c*.

In addition, for a circuit board 220, a dielectric substrate 221, a wiring pattern 221*a*, a connection terminal unit 221*b*, a protective layer 222, connection pad units 223, 224, 225, and 226 and electronic components 227, 228, and 229 are the same members as those described in the first embodiment, and thus, description thereof will be omitted.

The electro-optical device 200 of the present embodiment is different from that of the previous embodiment in that the electronic component mounting body 10P is directly mounted on the surface of one substrate 211 constituting the electro-optical panel 210. In other words, the electronic component mounting body 10P is directly mounted on the substrate 211 with the conductors 35 and 36 conductively connected to the input wiring 211d and the wiring 211c drawn out of the substrate pendent unit of the substrate 211 as described above. The substrate 211 is made of glass or plastic. Further, in the present embodiment, the electronic component mounting body 10P is arranged on the substrate 211, and heated and pressed. Under this circumstance, the surface layer of the base material 13 made of thermoplastic resin is softened and melted, and thus, is tightly fixed to the substrate 211.

Further, in the electronic component mounting body 10P according to the present invention, the conductors 35 and 36 are connected to the bumps 11 of the IC chip 10 with high precision and reliability, leading to improvement of reliability of the electro-optical device 200.

In addition, the electronic component mounting body 10P according to the present invention can be directly mounted on the substrate 211 of the electro-optical panel 210, so that it can be mounted without an anisotropic conductive layer. Thus, the mounting costs can be reduced and mounting can be efficiently performed.

Third Embodiment

Figure 10:
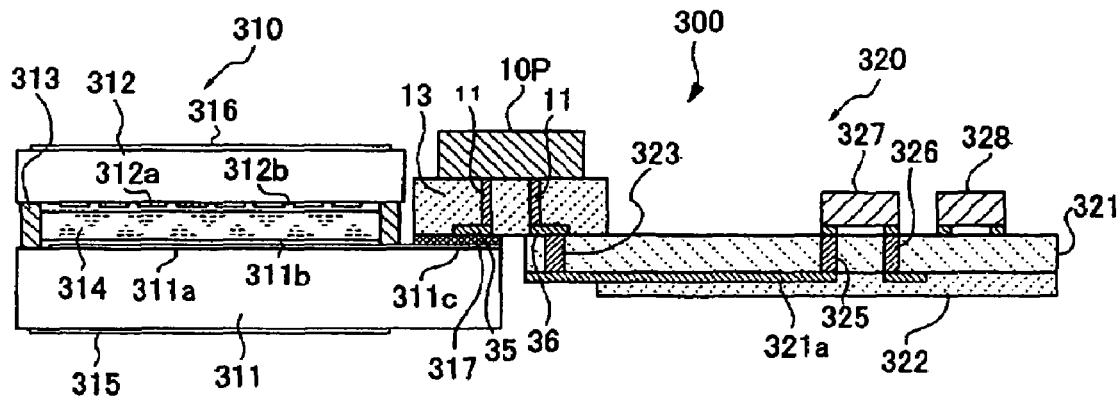
FIG. 10 is a cross sectional view showing a third embodiment of the present invention.

A third embodiment of the present invention will now be described with reference to FIG. 10. FIG. 10 is a partial cross sectional view of the electro-optical device of the present embodiment, and corresponds to a cross sectional view taken along a line of B-B' of FIG. 7 with respect to the overall configuration of the electro-optical device.

The electro-optical device (liquid crystal display device) 300 has an electro-optical panel 310 and a circuit board 320 mounted thereon. The electro-optical panel 310 has substantially the same arrangement as that electro-optical panel 110 of the first embodiment, in which substrates 311 and 312, a transparent electrode 311a, a pixel electrode 312a, alignment layers 311b and 312b, a wiring 311c, sealant 313, liquid crystal (electro-optical material) 314 and an anisotropic conductive layer 317 are the same members as those described in the first embodiment, so description thereof will be omitted.

In addition, for a circuit board 320, a dielectric substrate 321, a wiring pattern 321a, a protective layer 322, connection pad units 323, 325, and 326 and electronic components 327 and 328 are the same members as those described in the first embodiment, and thus, description thereof will be omitted.

In the electro-optical device 300 of the present embodiment, the electronic component mounting body 10P is mounted on the wiring 311c of the electro-optical panel 310 and the connection pad 323 of the circuit board 320, and as a result, the circuit board 320 is connected to the electro-optical panel 310 through the electronic component mounting body 10P. In the illustrated example, one end of the electronic component mounting body 10P is directly mounted on the circuit board 320, as in the first embodiment, and the other end thereof is conductively connected to the wiring 311c through the anisotropic conductive layer 317. However, it is also possible that the conductor 35 of the electronic component mounting body 10P is directly connected to the wiring 311c.

Further, in the electronic component mounting body 10P according to the present invention, the conductors 35 and 36 are connected to the bumps 11 of the IC chip 10 with high precision and reliability, leading to improvement of reliability of the electro-optical device 300.

Fourth Embodiment

Figure 11:
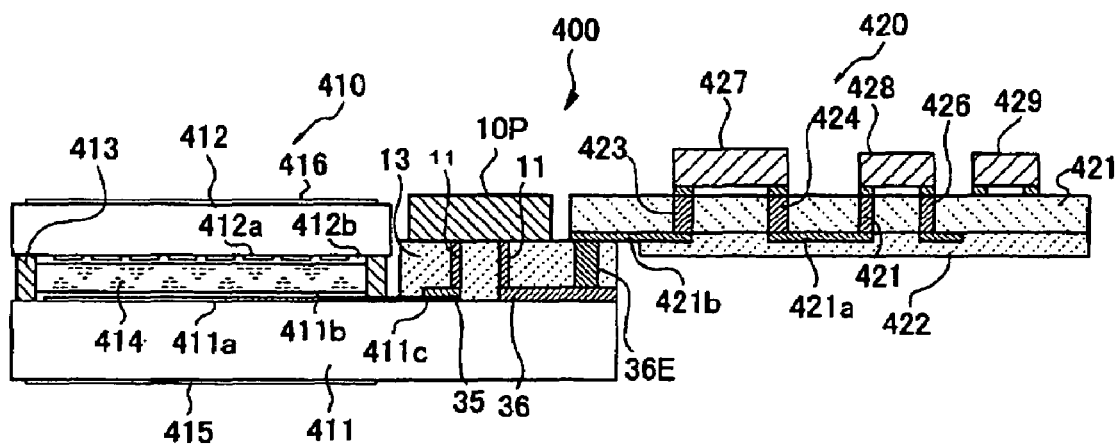
FIG. 11 is a cross sectional view showing a fourth embodiment of the present invention.

A fourth embodiment of the present invention will now be described with reference to FIG. 11. FIG. 11 is a partial cross sectional view of the electro-optical device of the present embodiment, and corresponds to a cross sectional view taken along a line of B-B' of FIG. 7 with respect to the overall configuration of the electro-optical device.

The electro-optical device (liquid crystal display device) 400 has an electro-optical panel 410 and a circuit board 420 mounted thereon. The electro-optical panel 410 has substantially the same arrangement as that electro-optical panel 210 of the second embodiment, in which substrates 411 and 412, a transparent electrode 411a, a pixel electrode 412a, alignment layers 411b and 412b, a wiring 411c, sealant 413, liquid crystal (electro-optical material) 414 and an anisotropic conductive layer 417 are the same members as those described in the second embodiment, so description thereof will be omitted.

In addition, for a circuit board 420, a dielectric substrate 421, a wiring pattern 421a, a connection terminal unit 421b, a protective layer 422, connection pad units 423, 424, 425, and 426 and electronic components 427, 428, and 429 are the same members as those described in the second embodiment, and thus, description thereof will be omitted.

The electro-optical device 400 of the present embodiment is different from that of the first embodiment in that the electronic component mounting body 10P is directly mounted on the surface of one side of the substrate 411 constituting the electro-optical panel 410. Further, it is different from that of the second embodiment in that the IC chip substrate of the electronic component mounting body 10P is connected to the circuit board 420.

The electronic component mounting body 10P is directly mounted on the substrate 411 with the conductor conductively connected to the wiring 411c drawn out of the substrate pendent unit. The substrate 411 is made of glass or plastic. Further, in the present embodiment, the electronic component mounting body 10P is arranged on the substrate 411, and heated and pressed. Under this circumstance, the surface layer of the base material 13 made of thermoplastic resin is softened and melted, and tightly fixed to the substrate 411.

In addition, on the electronic component mounting body 10P, a connection pad unit 36E connected to the conductor 36 arranged on the surface of the base material 13 is arranged. The connection terminal unit 421b of the circuit board 420 is conductively connected to the connection pad unit 36E. In the present embodiment, the electronic component mounting body 10P is directly mounted on the substrate 411 of the electro-optical panel 410 and the circuit board 420 is mounted on the electronic component mounting body 10P. Thus, it is advantageous that only one-time mounting task for the electro-optical panel 410 is required.

Further, in the electronic component mounting body 10P according to the present invention, the conductors 35 and 36 are connected to the bumps 11 of the IC chip 10 with high precision and reliability, leading to improvement of reliability of the electro-optical device 400. In addition, the electronic component mounting body 10P according to the present invention can be directly mounted on the substrate 411 of the electro-optical panel 410, so that it can be mounted without an anisotropic conductive layer. Thus, the mounting costs can be reduced and mounting can be efficiently performed.

Electronic Apparatus

Exemplary embodiments of an electronic apparatus according to the present invention will now be described with reference to FIGS. 12 and 13. In the present embodiments, an electronic apparatus having the electro-optical device (liquid crystal display device 200) as display means will be described.

First Embodiment

Figure 12:
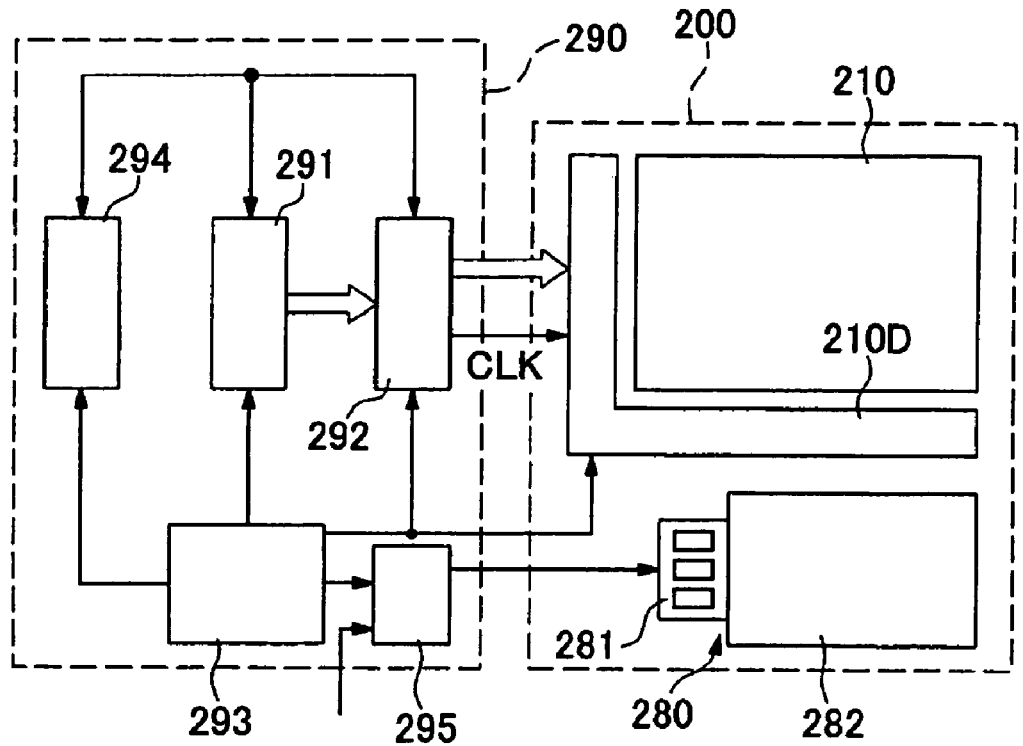
FIG. 12 is a diagram showing a control system of an electro-optical device.

FIG. 12 is a schematic diagram showing an overall configuration of a control system (display control system) for a liquid crystal display device 200 in the electronic apparatus of the present embodiment. The electronic apparatus described herein has a display control circuit 290 comprising a display information output source 291, a display information processing circuit 292, a power supply circuit 293, a timing generator 294, and a light source control circuit 295. In addition, the driving circuit 210D that drives the liquid crystal panel 210 is arranged in the liquid crystal display device 200 described above. The driving circuit 210D comprises a semiconductor IC chip of the electronic component mounting body 10P directly mounted on the liquid crystal panel 210 described above. However, in addition to the arrangement described above, the driving circuit 210D may comprise a circuit pattern formed on the panel surface, or, the semiconductor IC chip or the circuit pattern mounted on the circuit board conductively connected to the liquid crystal panel.

The display information output source 291 has a resonant circuit that outputs a digital image signal in synchronization with a memory such as read only memory (ROM) or random access memory (RAM) and a storage unit such as an optical storage disk or a magnetic storage disk and is arranged such that display information is supplied to the display information processing circuit 292 in a type such as an image signal having a predetermined format, based on various clock signals generated by a timing generator 294.

The display information processing circuit 292 comprising well-known various circuits such as a serial-parallel conversion circuit, an amplification and inversion circuit, a rotation circuit, a gamma correction circuit, and a clamp circuit performs processing of the input display information, and supplies the image information to the driving circuit 210D along with a clock signal CLK. The driving circuit 210D comprises a scanning line drive circuit, a signal line drive circuit and a test circuit. In addition, a power supply circuit 293 supplies predetermined voltages to elements described above, respectively.

The light source control circuit 295 supplies power provided from the power supply circuit 293 to the light source unit 281 (specifically, a light emitting diode, etc.) of the lighting device 280, based on the control signal introduced from the outside. The light source control circuit 295 controls on and off of each light source unit 281, in response to the control signal. In addition, light emitted from the light source unit 281 is illuminated on the liquid crystal panel 210 through a waveguide plate 282.

Second Embodiment

Figure 13:
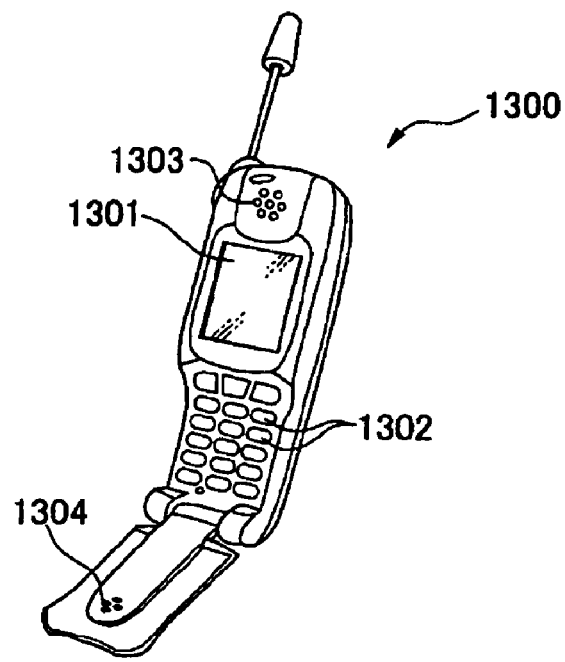
FIG. 13 is a perspective view showing an example of an electronic apparatus.

Next, FIG. 13 shows an appearance of a mobile phone as an embodiment of an electronic apparatus according to the present invention. An electronic apparatus 1300 has a display unit 1301, a control unit 1302, a telephone receiver unit 1303, and a telephone transmitter unit 1304, and the display unit 1301 is arranged with the liquid crystal display device 200, and comprises the circuit board 200 connected to the liquid crystal panel 210. In addition, on the surface of the display unit 1301, the liquid crystal panel 210 driven and controlled by the IC chip on the circuit board 220 is arranged to be visible.

The present invention is not limited to the illustrated embodiments, and it will be appreciated that various modifications can be made without departing from the spirit of the present invention. For example, it is possible that the electro-optical device can be used in an active matrix type liquid crystal display device (e.g., liquid crystal display device having thin film transistor (TFT) or thin film diode (TFD) as switching elements), in addition to a passive matrix. In addition, it is possible that an electronic component mounting body according to the present invention, a manufacturing method of an electro-optical device can be applied to various electro-optical devices such as a field emission device, an organic electroluminescent device, a plasma display device, an electrophoresis display device, and an electron emission device (field emission display and surface-conduction electron-emitter display), besides the liquid crystal display device.

What is claimed is:

1. A method of manufacturing an electronic component mounting body for use in mounting an electronic component having a plurality of bumps as external mounting terminals on a base material made of thermoplastic resin, the method comprising:

a bump embedding step of embedding the bumps into the base material by heating and pressing the electronic component against and partially through the base material;

exposing a portion of the bumps onto a surface of the base material that is opposite to the side that the electronic component is pressed against; and a conductor forming step of forming a conductor conductively connected to the bumps by arranging a conductive material on the base material surface on which the portion of the bumps is exposed, the conductor forming step comprising:

forming a pattern of a mask material on the base material at which the portion of the bumps is exposed by arranging photoresist on the base material, exposing the photoresist using the portion of the bumps exposed through the base material as a reference for forming the pattern of the mask material, and developing the photoresist; and selectively arranging the conductor on the base material using the mask material as a mask.

2. The method according to claim 1, wherein the base material is the same thickness as or at most 10 µm thicker than a protrusion of the bump of the electronic component from the surface of the electronic component.

3. The method according to claim 1, wherein the base material is the same thickness as or at most 5 µm thicker than a protrusion of the bump of the electronic component from the surface of the electronic component.

4. The method according to claim 1, wherein in the bump embedding step, after the bumps are embedded into the base material, the surface of the base material on the opposite side of the electronic component is partially removed to expose the portion of the bumps at the surface of the base material on the opposite side of the electronic component.

5. The method according to claim 4, wherein the surface of the base material is partially removed through a chemical polishing process or a dry etching process.

6. The method according to claim 1, wherein, in the conductor forming step, the conductor is formed through a metal plating method.

7. The method according to claim 1, further comprising:
prior to the conductor forming step, forming a metal priming layer on the surface area of the base material including a portion of the bumps exposed through the base material.

8. The method according to claim 7, wherein the conductor is formed on the metal priming layer through an electrolytic plating method.

9. The method according to claim 6, wherein the conductor is formed using an electroless plating method.

10. The method according to claim 1, wherein while performing the exposure of the photoresist, the reference bumps arranged on the electronic component are used for alignment.

11. A method of manufacturing an electronic component mounting body for use in mounting an electronic component having a plurality of bumps as external mounting terminals on a base material made of thermoplastic resin, the method comrrising:

a bump embedding step of embedding the bumps into the base material by heating and pressing the electronic component against and partially through the base material;

exposing a portion of the bumps onto a surface of the base material that is opposite to the side that the electronic component is pressed against; and a conductor forming step of forming a conductor conductively connected to the bumps by arranging a conductive material on the base material surface on which the portion of the bumps is exposed, the conductor forming step comprising:

forming a pattern of a mask material on the base material at which the portion of the bumps is exposed by arranging photoresist on the base material and exposing and developing the photoresist; and selectively arranging the conductor on the base material using the mask material as a mask, and wherein a reference mark for performing the exposure of the photoresist is arranged using the bump exposed through the base material.

12. The method according to claim 1, wherein, for the bump forming step, the height of the bump exposed through the base material is 1 μm or more.

13. The method according to claim 10, comprising:
prior to the step of arranging the photoresist, forming a protective member that covers the portion of the bumps exposed through the base material, then forming the photoresist on the base material including the protective member, and then removing the protective member, wherein the step of performing the exposure of the photoresist is performed using the bump exposed by removing the protective member as a reference.

14. The method according to claim 7, wherein the conductor is formed using an electroless plating method.

15. The method according to claim 11, comprising:
prior to the step of arranging the photoresist, forming a protective member that covers the portion of the bumps exposed through the base material, then forming the photoresist on the base material including the protective member, and then removing the protective member, wherein the step of performing the exposure of the photoresist is performed using the bump exposed by removing the protective member as a reference.

* * * * *